(12) United States Patent
Yoshida et al.

(10) Patent No.: US 6,567,447 B1
(45) Date of Patent: May 20, 2003

(54) SEMICONDUCTOR LASER DEVICE AND SEMICONDUCTOR LASER MODULE USING THE SAME

(75) Inventors: Junji Yoshida, Tokyo (JP); Naoki Tsukiji, Tokyo (JP); Akira Iketani, Tokyo (JP); Naoki Kimura, Tokyo (JP); Jun Niekawa, Tokyo (JP); Toshio Kimura, Tokyo (JP); Takeshi Aikiyo, Tokyo (JP)

(73) Assignee: The Furukawa Electric Co., Ltd. (JP)

( * ) Notice: Subject to any disclaimer, the term of this patent is extended or adjusted under 35 U.S.C. 154(b) by 0 days.

(21) Appl. No.: 09/680,153

(22) Filed: Oct. 3, 2000

Related U.S. Application Data

(63) Continuation of application No. PCT/JP00/00590, filed on Feb. 3, 2000.

(30) Foreign Application Priority Data

| Feb. 3, 1999 | (JP) | 11-026476 |
| Apr. 30, 1999 | (JP) | 11-123868 |

(51) Int. Cl.[7] .................................................. H01S 5/00
(52) U.S. Cl. .......................................... 372/49; 372/45
(58) Field of Search ................................ 372/43–50, 34, 372/36

(56) References Cited

U.S. PATENT DOCUMENTS

| 4,616,898 A | 10/1986 | Hicks, Jr. ............... 350/96.15 |
| 5,189,679 A | 2/1993 | Derry, Jr. ..................... 372/45 |
| 5,305,336 A | 4/1994 | Adar et al. ................... 372/18 |
| 5,563,732 A | 10/1996 | Erdogan et al. ............. 359/341 |
| 5,699,377 A | 12/1997 | Pan ............................... 372/92 |

(List continued on next page.)

FOREIGN PATENT DOCUMENTS

| EP | 800243 A2 | 10/1997 | H01S/3/025 |
| EP | 0812040 A | 12/1997 | H01S/3/085 |
| JP | 62-276892 A | 12/1987 | H01S/3/18 |
| JP | 03-049281 A | 3/1991 | H01S/3/18 |
| JP | 04-343492 A | 11/1992 | H01S/3/18 |

(List continued on next page.)

OTHER PUBLICATIONS

Full English–language translation of JP 08–330671–A, Hitach LTD, Dec. 1996.*

(List continued on next page.)

*Primary Examiner*—Quyen Leung
(74) *Attorney, Agent, or Firm*—Sheppard Mullin Richter & Hampton LLP

(57) ABSTRACT

In the semiconductor laser device of the present invention, a semiconductor stacked structure including an active layer comprising a strained multi-quantum well structure is formed on a substrate 1, a cavity length is larger than 1000 μm but equal to or smaller than 1800 μm, and a low-reflection film $S_1$ having a reflectance of 3% or less is formed on one facet and a high-reflection film $S_2$ having a reflectance of 90% or more is formed on the other facet. The semiconductor laser module has a structure in which the semiconductor laser device is set to a cooling device constituted by electrically alternately arranging 40 pairs or more of the Peltier elements and holding them by top and bottom ceramic plates and sealed in the package. A grating having a reflection bandwidth of 1.5 nm or less is formed on an optical fiber to be built in.

40 Claims, 9 Drawing Sheets

U.S. PATENT DOCUMENTS

| | | | |
|---|---|---|---|
| 5,721,636 A | 2/1998 | Erdogan et al. | 359/341 |
| 5,724,377 A | 3/1998 | Huang | 372/22 |
| 5,737,474 A | 4/1998 | Aoki et al. | 385/131 |
| 5,801,403 A | 9/1998 | He | 257/94 |
| 5,845,030 A | 12/1998 | Sasaki et al. | 385/88 |
| 5,936,763 A | 8/1999 | Mitsuda et al. | 359/341 |
| 5,960,019 A | 9/1999 | Hayashi et al. | 372/46 |
| 5,978,401 A | 11/1999 | Morgan | 372/50 |
| 5,995,525 A | 11/1999 | Kosugi | 372/36 |
| 5,995,692 A | 11/1999 | Hamakawa et al. | 385/49 |

FOREIGN PATENT DOCUMENTS

| | | | | |
|---|---|---|---|---|
| JP | 05-136511 A | 6/1993 | | H01S/3/131 |
| JP | 05-206579 A | 8/1993 | | H01S/3/18 |
| JP | 05-206580 A | 8/1993 | | H01S/3/18 |
| JP | 5-315705 A | 11/1993 | | H01S/3/18 |
| JP | 05-327031 A | 12/1993 | | H01L/35/28 |
| JP | 07-099373 A | 4/1995 | | H01S/3/18 |
| JP | 07-333470 A | 12/1995 | | G02B/6/42 |
| JP | 8-201609 A | 8/1996 | | G02B/5/18 |
| JP | 08-330671 A | 12/1996 | | H01S/3/18 |
| JP | 09-083059 A | 3/1997 | | H01S/3/18 |
| JP | 09-083070 A | 3/1997 | | H01S/3/18 |
| JP | 09-219475 A | 8/1997 | | H01L/23/38 |
| JP | 09-260766 A | 10/1997 | | H01S/3/18 |
| JP | 09-269439 A | 10/1997 | | G02B/6/42 |
| JP | 09-275240 A | 10/1997 | | H01S/3/18 |
| JP | 9-283847 A | 10/1997 | | H10S/3/18 |
| JP | 09-298319 A | 11/1997 | | H01L/35/30 |
| JP | 10-062654 A | 3/1998 | | G02B/6/42 |
| JP | 10-154847 A | 6/1998 | | H01S/3/18 |
| JP | 11-017248 A | 1/1999 | | H01S/3/085 |

OTHER PUBLICATIONS

G. P. Agrawal, "Longitudinal–Mode Stabilization in Semiconductor Lasers with Wavelength–Selective Feedback," Journal of Applied Physics, vol. 59, No. 12, Jun. 15, 1986, pp. 3958–3961.

S. Oshiba, et al., "High–Power Output Over 200mW of 1.3 μm GaInAsP VIPS Lasers," IEEE Journal of Quantum Electronics, vol. QE–23, No. 6, Jun. 1987, pp. 783–743.

Toshio Nonaka, "Pumping Sources For Optical Fiber Amplifiers," Optronics, (published by The Optronics Co., Ltd.), No. 107, Nov. 1990. (In Japanese, English–Language Abstract on last page).

Asano, et al., "1.48μm High–Power InGaAs/InGaAsP MQW LD's for Er–Doped Fiber Amplifiers," IEEE Photonics Technology Letters, vol. 3, No. 5, May 1991, pp. 415–417.

Ikuo Mito and Kenji Endo, "1.48 μm and 0.98 μm High–Power Laser diodes for Erbium–Doped Fiber Amplifiers," Optical amplifiers and their applications, summaries of papers presented at the Optical Amplifiers and Their Applications Topical Meeting, Jul. 24–26, 1991, Snowmass Village, Colorado, cosponsored by IEEE/Lasers and Electro–optics Society and the Optical Society of America, Technical digest series. 1991, v. 13, pp. 22–25.

T. Higashi, et al., "Optimum Asymmetric Mirror Facets Structure for High Efficiency Semiconductor Lasers," 13th International Semiconductor Laser Conference, Sep. 1992, Takamatsu Japan, pp. 46–47.

C. R. Giles, et al., "Simultaneous Wavelength–Stabilization of 980–nm Pump Lasers," Optical amplifiers and their applications, summaries of papers presented at the Optical Amplifiers and Their Applications Topical Meeting, Jun. 4–6, 1993, Yokohama, Japan, cosponsored by Optical Society of America and the IEEE Lasers and Electro–Optics Society, pp. 380–383.

A. Kasukawa, et al.,"Extremely High Power 1.48 μm GaInAsP/InP GRIN–SCH Strained MQW Lasers," IEEE Photonics Technology Letters, vol. 6, No. 1, Jan. 1994, pp. 4–6.

M. Shigehara, et al., "Single Longitudinal Mode Laser Diode using Fiber Bragg Grating," Proceedings of the 1995 of the IEICE General Conference (The Institute of Electronics, Information and Communications Engineers), Mar. 27, 1995, pp. 380 (In Japanese, Partial English–language translation attached).

T. Wakami, et al., "0.98 μm Laser Diode with Fiber Bragg Gratings," Proceedings of the 1995 Electronics Society Conference of IEICE (The Institute of Electronics, Information and Communications Engineers), Sep. 5, 1995, pp. 156 (In Japanese, Partial English–language translation attached).

R. J. Cambell, et al., "A Wavelength Stable Uncooled Laser for Access Networks," Proceedings of the 21st European Conference on Optical Communications (ECOC'95), Brussels, Belgium, Sep. 17–21, 1995, pp. 545–548.

Don Hargreaves, et al., "High–power 980–nm Pump Module Operating Without a Thermoelectric Cooler," 1996 Technical Digest Series (Conference Edition) of the Optical Fiber Communication 1996 ("OFC '96"), Optical Society of America, Feb. 25, 1996 (San Jose California), pp. 229–230.

J. Piprek, et al., "Cavity Length Effects on Internal Loss and Quantum Efficiency of Multiquantum–Well Lasers," IEEE Journal of Selected Topics in Quantum Electronics, vol. 5, No. 3, May/Jun. 1999, pp. 643–647 (UCSB).

P. Gavrilovic, et al., "CW High Power Single Lobed Far–Field Operation of Long Cavity AlGaAs–GaAs Single Quantum–Well Laser Diodes Grown by MOCVD," IEEE Journal of Quantum Electroncis, vol. 27, No. 7, Jul., 1991, pp. 1859–1862.

Akihiko Kasukawa, Tomokazu Mukaihara, Takeharu Yamaguci, Jun'jiro Kikawa, "Recent Progress of High Power Semiconductor Lasers for EDFA Pumping," Furukawa Review, No. 19, Apr. 2000, pp. 23–28.

Akihiko Kasukawa, Tomokazu Mukaihara, Takeharu Yamaguchi, Jun'jiro Kikawa, "Recent Progress in High–Power Semiconductor Lasers for Pumping of Optical Fiber Amplifiers," Furukawa Electric Review, No. 105, Jan. 2000, pp. 13–18. (In Japanese).

Toshio Kimura, Naoki Tsukiji, Junji Yoshida, Naoki Kimura, Takeshi Aikiyo, Tetsuro Ijichi, and Yoshikazu Ikegami, "1480–nm Laser Diode Module with 250–mW Output for Optical Amplifiers (Fol 1404QQ Series)," Furukawa Review, No. 19, Apr. 2000, pp. 29–33.

Toshio Kimura, Naoki Tsukiji, Junji Yoshida, Naoki Kimura, Takeshi Aikiyo, Tetsuro Ijichi, and Yoshikazu Ikegami, "250 mW—1480 nm Laser Diode Module for Optical Amplifiers (Fol 1404QQ Series)," Furukawa Electric Review, No. 105, Jan. 2000, pp. 19–23, (In Japanese).

Akira Mugino and Yuichiro Irie, "Output Power Optimization in 980–nm Pumping Lasers Wavelength–Locked Using Fiber Bragg Gratings," Furukawa Review, No. 19, Apr. 2000, pp. 41–46.

Akira Mugino and Yuichiro Irie, "Output Power Optimization of 980–nm Pumping Lasers Wavelength–Locked Using Fiber Bragg Gratings," Furukawa Electric Review, No. 105, Jan. 2000, pp. 24–29. (In Japanese).

Yoshihiro Emori and Shu Namiki, "Demonstration of Broadband Raman Amplifiers: a Promising Application of High–power Pumping Unit," Furukawa Review, No. 19, Apr. 2000, pp. 59–62.

Yoshihiro Emori and Shu Namiki, "Demonstration of Broadband Raman Amplifiers as a Promising Application of High–power Pumping Unit," Furukawa Electric Review, No. 105, Jan. 2000, pp. 42–45 (In Japanese).

Osamu Aso, Masateru Taadakuma, Shu Namiki, "Four–Wave Mixing in Optical Fibers and Its Applications," Furukawa Review, No. 19, Apr. 2000, pp. 63–68.

Osamu Aso, Masateru Taadakuma, Shu Namiki, "Four–Wave Mixing in Optical Fibers and Its Applications," Furukawa Electric Review, No. 105, Jan. 2000, pp. 46–51 (In Japanese).

Hitoshi Shimizu, Kouji Kumada, Nobumitsu Yamanaka, Norihiro Iwai, Tomokawa Mukaihara, and Akihiko Kasukawa, "Extremely Low threshold 1.3$\mu$m InAsp n–Type Modulation Doped MQW Lasers," Furukawa Review, No. 19, Apr. 2000, pp. 149–154.

Hitoshi Shimizu, Kouji Kumada, Nobumitsu Yamanaka, Norihiro Iwai, Tomokazu Mukaihara, and Akihiko Kasukawa, "Extremely Low threshold 1.3$\mu$m InAsP n–Type Modulation Doped MQW Lasers," Furukawa Electric Review, No. 104, Jul. 1999, pp. 48–52. (In Japanese).

H. Yamazaki, et al., "Over Half–Wall Output Power 1.48–$\mu$m Wavelength EDFA Pumping ASM LD's ," Optical Fiber Communication Conference and Exhibit 2000 (OFC'2000), Baltimore, Maryland, Mar. 9, 2000.

Kasukawa, et al., "High Power Semiconductor Lasers for Optical Fiber Amplifiers," Technical report of the Institute of Electronics, Information and Communication Engineers (IEICE), vol. 96, No. 188, Jul. 1996, pp. 23–30. (In Japanese, English–Language Abstract).

Prosyk, et al., "Well Number, Length, and Temperature Dependence of Efficiency and Loss in InGaAsP–InP Compressively Strained MQW Ridge Waveguide Lasers at 1.3 $\mu$m," IEEE Journal of Quantum Electronics, vol. 33, No. 8, Aug. 1997, pp. 1360–1368.

Hamakawa, et al., "Wavelength Stabilization of 1.48 $\mu$m Pump Laser by Fiber Grating," 22–nd European Conference on Optical Communication—ECOC '96, Oslo, 1996, vol. 1, pp. 119–122. (no month).

English Translation of JP–05–206579–A, previoulsy provided as Citation B15.

Full English translation of: M. Shigehara, et al., "Single Longitudinal Mode Laser Diode using Fiber Bragg Grating," Proceedings of the 1995 of the IEICE General Conference (The Institute of Electronics, Information and Communications Engineers), Mar. 27, 1995, p. 380, previously provided as Citation C 90.

T. Kamijoh, et. al, "Improved Operation Characteristics of Long–Wavelength Lasers Using Strained MQW Active Layers," IEEE Journal of Quantum Electronics, vol. 30, No. 2, pp. 524–532, Feb. 1994, IEEE, New York.

T. R. Chen, et al., "Cavity Length Dependence of the Wavelength of Strained–Layer InGaAs/GaAs Lasers," Applied Physics Letters, vol. 57, No. 23, pp. 2402–2403, Dec. 3, 1990, American Institute of Physics, New York.

* cited by examiner

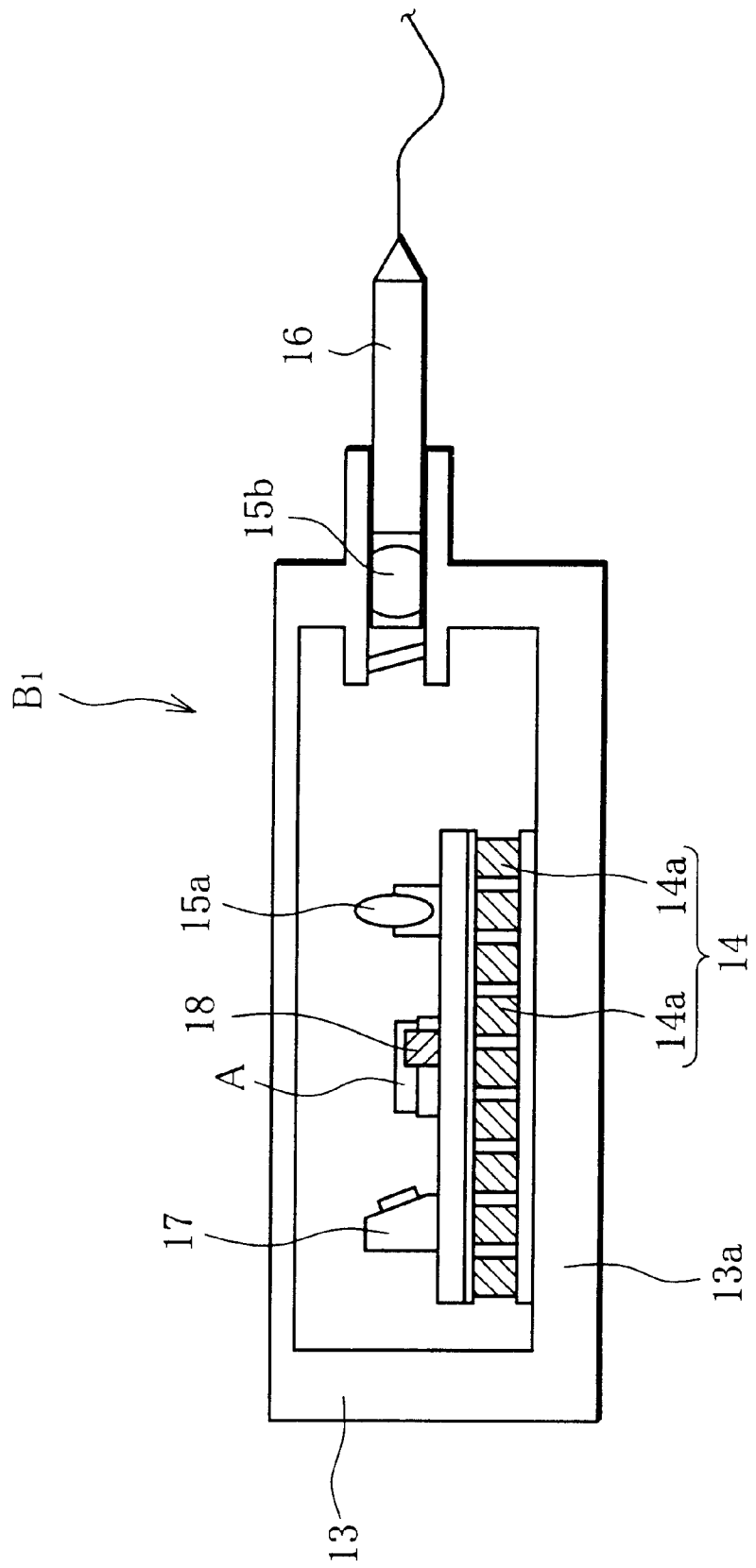

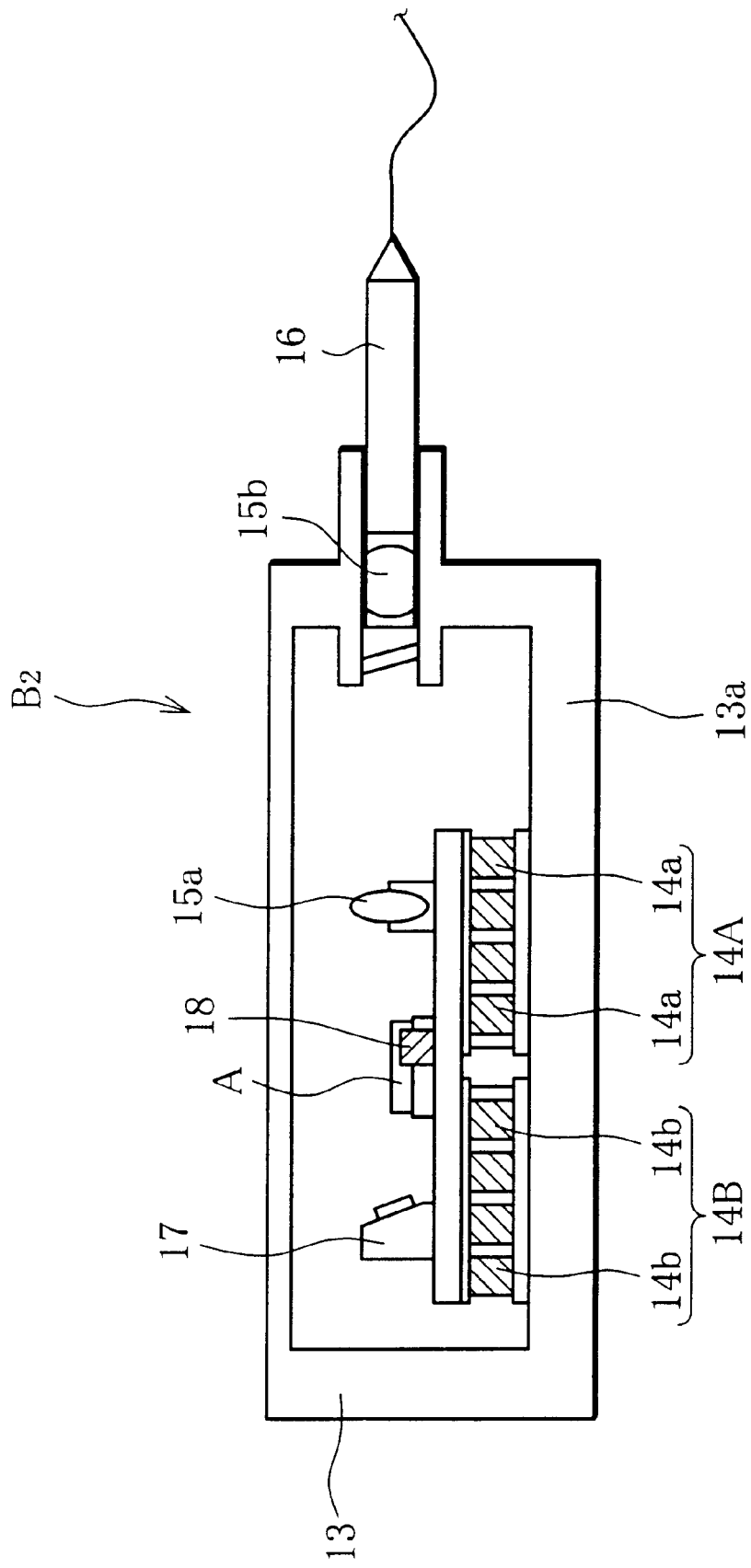

SEMICONDUCTOR LASER DEVICE AND SEMICONDUCTOR LASER MODULE USING THE SAME

This application is a continuation of international application number PCTJP00/00590, filed Feb. 3, 2000.

TECHNICAL FIELD

The present invention relates to a semiconductor laser device and a semiconductor laser module using the semiconductor laser device, particularly to a semiconductor laser device free from output reduction due to internal absorption and a semiconductor laser module whose power consumption required for driving is reduced, whose failure rate is halved compared to a conventional failure rate, whose loss can be reduced even when multiplexing a laser beam, and whose maximum optical-fiber output is 180 mW or more, since the semiconductor laser device is built therein.

PRIOR ART

Because a semiconductor laser device having an active layer (luminous region) comprising a multi-quantum well structure operates at a high optical output compared to the case of a semiconductor laser device having an active layer of a bulk semiconductor, the study for practically using the semiconductor laser device as a light source of a erbium-doped optical-fiber amplifier is progressed. For example, in the case of a laser device to be operated at a range of 1.48 $\mu$m, by forming a two-dimensional heterostructure having a lattice-matched multi-quantum well structure using GaIn-AsP material system on an InP substrate, a buried heterostructure (BH structure) laser device in which a single transverse mode is controlled is practically used as a pumping light source for an optical-fiber amplifier. Moreover, it is requested to further increase the optical output of the semiconductor laser device.

To realize high-output power of the semiconductor laser device having an active layer comprising a multi-quantum well structure, it is effective to increase the cavity length of the laser device. This is because, by increasing the cavity length, a larger current can be injected even with the same threshold current density and thereby, an optical output is raised.

However, when a multi-quantum well structure of an active layer is constituted of a lattice-matching system, a driving current at which optical output power is saturated increases by increasing a cavity length but a problem occurs that reduction of the external quantum efficiency becomes predominant due to internal absorption and an optical output rather lowers. Therefore, in the case of a semiconductor laser device having a multi-quantum well structure of the lattice-matching system, it is avoided to set the cavity length of the semiconductor laser device to 1000 $\mu$m or more.

Meanwhile, a pumping light source for an optical-fiber amplifier having the structure schematically shown in FIG. 1 is known. The light source obtains an optical output of 250 mW or more from an optical fiber F by multiplexing optical outputs supplied from two laser modules M and M respectively having an optical output of approximately 140 mW by an optical coupler C. The request for higher output is intensified to the light source.

In the case of the light source shown in FIG. 1, optical outputs supplied from the laser modules M and M are attenuated when multiplexed by the optical coupler C. Therefore, an optical output of a usable light source becomes smaller than an optical output (sum of optical outputs of two laser modules) which can be essentially expected from laser modules used. That is, an energy conversion efficiency which is defined by the ratio of an optical output power from an optical-fiber end to the total driving power of laser modules is lowered. Moreover, the function as a light source disappears if one of the two modules M and M which are used in FIG. 1 fails. That is, the light source is lacking in the reliability as a high-output light source.

Moreover, as a pumping light source in which optical outputs from a plurality of laser modules are coupled, for example, U.S. Pat. No. 5,936,763 discloses an art for fabricating a high-output pumping light source by using a plurality of semiconductor laser modules having oscillation wavelengths different from each other, the oscillation laser beams of which are wavelength-multiplexed by a wavelength-multiplexing coupler.

In this prior art, oscillation laser beams from semiconductor laser devices in semiconductor laser modules are fixed by a diffraction grating and then, wavelength-multiplexed by a wavelength-multiplexing coupler.

However, when fixing (or locking) an oscillation wavelength of a semiconductor laser device, it is difficult to stably control an optical output because the change in driving current and in ambient temperature could cause the longitudinal modes of the oscillating laser light of the semiconductor laser to shift accordingly thereby giving rise to kinks in light output versus injection current characteristics as shown in FIG. 2.

As a laser module for solving such problems, the following semiconductor laser module is disclosed in U.S. Pat. No. 5,845,030.

That is, the module disclosed in the U.S. patent has a structure obtained by arranging optical fibers with a grating formed therein at the output facet of a semiconductor laser device. In this case, a reflection bandwidth of the grating is set to a value larger than a wavelength interval of longitudinal modes of a laser beam oscillated from the semiconductor laser device, specifically to a value of 2 nm or more so as to mitigate the influence of the longitudinal-mode fluctuation on an optical output from an optical fiber of the module when the semiconductor laser device is driven.

The above-described grating shows a reflection spectrum having a reflectance only in a wavelength range about a specific wavelength ($\lambda_0$) as shown in FIG. 3. In FIG. 3, the wavelength width between the wavelength at which the reflectance is half the peak reflectance is referred to as reflection bandwidth.

However, when wavelength-multiplexing is performed by the module of the prior art, the following problems occur.

That is, as a result of setting the reflection bandwidth of the grating to 2 nm or more, the spectral width of a laser beam output from the optical fiber of the module increases and thereby, the number of oscillated wavelengths which can be multiplexed by a wavelength-multiplexing coupler having a narrow transmission band decreases, a degree of multiplexing lowers, and the loss of the wavelength-multiplexing coupler increases.

It is an object of the present invention to solve the above-described problems of a semiconductor laser device having a multi-quantum well structure and to provide a semiconductor laser device in which an optical output is not lowered even if a cavity length is set to a value larger than 1000 $\mu$m.

Moreover, it is another object of the present invention to provide by using the above-described semiconductor laser device a semiconductor laser module in which the device driving currents can be decreased to provide high driving reliability, and wavelength-multiplexing coupler has a small loss in wavelength-multiplexing. The semiconductor laser module of the present invention can be used as a high-output pumping light source for an optical-fiber amplifier compared to a conventional pumping light source which has a maximum optical-fiber output of 180 mW or more, for example.

DISCLOSURE OF THE INVENTION

To achieve the above-described objects, the present inventors made intensive studies and in the course of their research, they noticed the fact that an optical output of a semiconductor laser device is specified by an integrated value of an efficiency and an injected current density of the semiconductor laser device and examined the relation between efficiencies and cavity lengths of a semiconductor laser device having a lattice-matching-system quantum well structure and a semiconductor laser device having a lattice-mismatching-system quantum well structure with respect to the noticed fact. As a result, they had an idea that it is possible to fabricate a semiconductor laser device for emitting light at a high output compared to a conventional device by setting a cavity length to a value equal to or more than a certain value, further continued the studies and then, finally developed a semiconductor laser device and a semiconductor laser module using the semiconductor laser device of the present invention.

That is, in the semiconductor laser device of the present invention, a stacked structure of a semiconductor including an active layer comprising a strained multi-quantum well structure is formed on a substrate, a cavity length is larger than 1000 μm but 1800 μm or less, a low-reflection film having a reflectance of 3% or less is formed on one facet, and a high-reflection film having a reflectance of 90% or more is formed on the other facet. Particularly, a semiconductor laser device which has a compressed strained multi-quantum well structure in which the strained multi-quantum well structure has a lattice-mismatching rate of 0.5 to 1.5%, preferably 0.5 to 1.1% is provided.

Moreover, the present invention provides a semiconductor laser module in which a semiconductor laser device is sealed in a package while set to a cooling device comprising Peltier elements (thermoelectric effect elements) and an optical fiber is opposed to the output facet of the semiconductor laser device. The present invention provides a semiconductor laser module in which the cooling device is preferably constituted by electrically alternately arranging 40 pairs or more of p-type and n-type conductive Peltier elements and holding these elements by top and bottom ceramic substrates and in which a grating having a reflection bandwidth of 2 nm or less, preferably 1.5 nm or less and larger than the longitudinal-mode wavelength interval of a laser beam oscillated from the semiconductor laser device is formed on the fiber. In the subsequent description, the number of pairs of a p-type and an n-type Peltier elements is defined as "the number of pairs".

BRIEF DESCRIPTION OF THE DRAWINGS

FIG. 6 is a schematic view showing a semiconductor laser module $B_1$ of the present invention;

FIG. 7 is a schematic view showing another semiconductor laser module $B_2$ of the present invention;

BEST MODE FOR CARRYING OUT THE INVENTION

Figure 4:
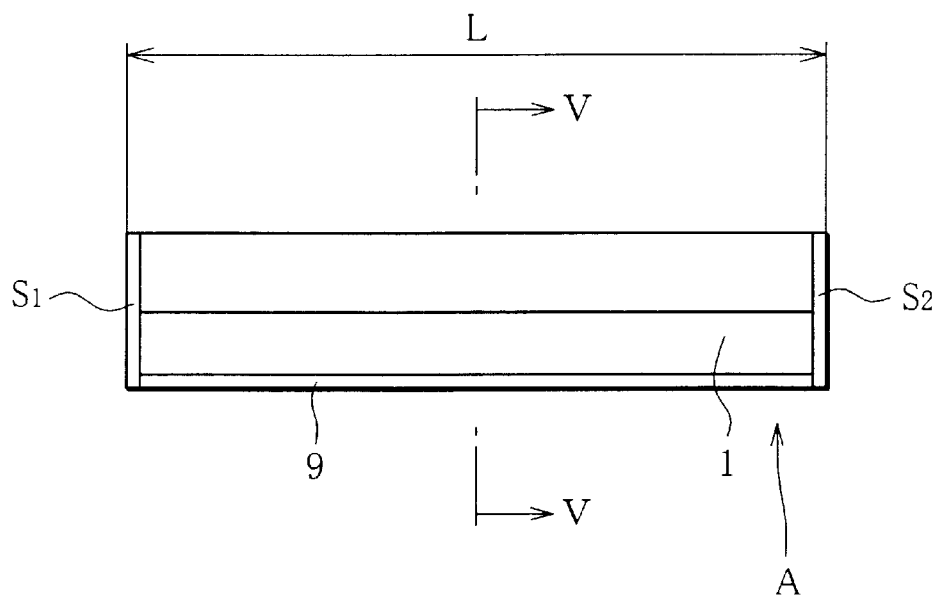
FIG. 4 is a side view showing a semiconductor laser device A of the present invention.
Figure 5:
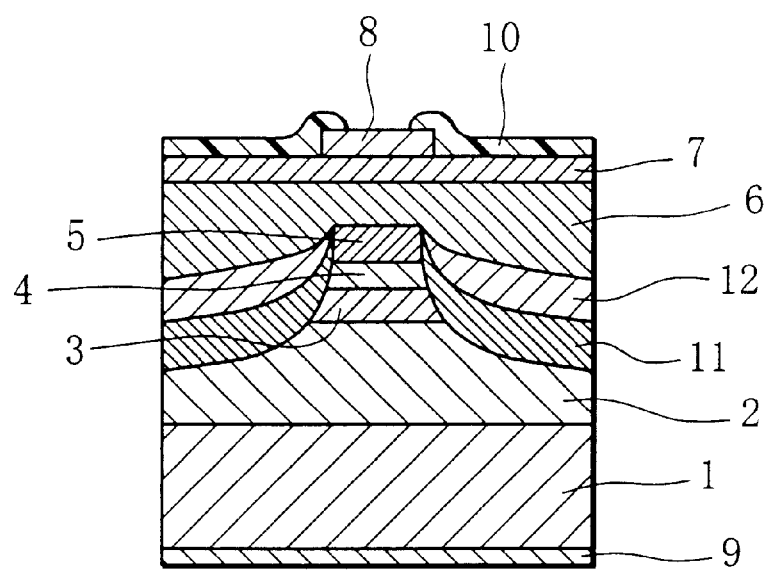
FIG. 5 is a cross-sectional view along the line IV—IV in FIG. 3.

A cross-sectional structure of one example of a semiconductor laser device of the present invention is shown in FIG. 4 and FIG. 5 that is a cross-sectional view along the line V—V in FIG. 4.

The device A has a structure in which a stacked structure to be mentioned later is formed by performing epitaxial growth of a predetermined semiconductor on a substrate 1 made of the predetermined semiconductor by well-known epitaxial growth methods such as metal-organic chemical vapor deposition method, liquid phase epitaxy method, molecular-beam epitaxy, gas-source molecular-beam epitaxy, or chemical-beam epitaxy, then cleavage is performed to set a predetermined cavity length (L), and moreover a low-reflection film $S_1$ to be mentioned later is formed on one cleaved facet, a high-reflection film $S_2$ is formed on the other cleaved facet, and furthermore a lower electrode 9 is formed on the back of the substrate 1 and an upper electrode 8 is formed on the upper face of the stacked structure.

The stacked structure shown in FIG. 4 has a buried heterostructure (BH structure) in which a lower clad layer 2 made of, for example, n-InP, a lower Grin-SCH layer 3 made of, for example, non-doped GaInAsP, an active layer 4 of a lattice-mismatching-system multi-quantum well structure made of, for example, GaInAsP, and an upper Grin-SCH layer 5 made of, for example, non-doped GaInAsP are sequentially stacked on the substrate 1 made of, for example, n-InP. Moreover, an upper clad layer 6 made of, for example, p-InP and a cap layer 7 made of, for example, p-GaInAsP are stacked on the upper Grin-SCH layer 5. Then, an upper electrode 8 is formed on the cap layer 7 and a lower electrode 9 is formed on the back of the substrate 1.

Furthermore, by stacking in order a p-InP layer 11 and an n-InP layer 12 on the side faces of the lower clad layer 2, lower Grin-SCH layer 3, active layer 4, and upper Grin-SCH layer 5, a current confinement portion for supplying current to the active layer 4 is formed.

In the above-described stacked structure, the active layer 4 is constituted of a strained multi-quantum well structure. Specifically, a compressed strained multi-quantum well structure is formed in which a lattice-mismatching rate becomes +0.5 to +1.5%, preferably 0.5 to 1.1% to the substrate 1. Moreover, it is preferable that the number of wells is 3 to 5.

When the absolute value of the lattice-mismatching rate is smaller than 0.5%, the active layer 4 shows the same behavior as the case of a lattice-matching system. For example, when a cavity length (L) is equal to 1000 $\mu$m, the optical output is 200 mW at most. When the lattice-mismatching rate is larger than 1.5%, problems occur that a crystal strain of the active layer is relaxed, crystallinity is deteriorated, and laser device characteristics are deteriorated. Particularly, the larger the number of wells and the thicker the well-layer thickness, the more critical the problem is.

Moreover, in the case of a semiconductor laser device of the present invention, by constituting the active layer 4 of the above-described lattice-mismatching-system multi-quantum well structure and simultaneously setting the reflectance of the low-reflection film $S_1$ formed on a light-output facet to 3% or less as described later, it is possible to realize high-output light emission even when increasing the cavity length (L) to a value larger than 1000 $\mu$m. However, when setting the cavity length (L) to a value larger than 1800 $\mu$m, deterioration of an optical output due to internal absorption is recognized even if the above-described requisites are met. Therefore, the cavity length (L) is set to a value larger than 1000 $\mu$m but equal to or less than 1800 $\mu$m.

In this case, the reflectance of the low-reflection film $S_1$ formed on the light-output facet is set to 3% or less and the reflectance of the high-reflection film $S_2$ formed on the other facet is set to 90% or more.

Particularly, it is necessary to set the reflectance of the low-reflection film $S_1$ to 3% or less. If the reflectance is set to a value larger than 3%, the efficiency is lowered and an optical output is deteriorated.

It is preferable that the low-reflection film $S_1$ is constituted of, for example, a single layer of $Al_2O_3$ or a dielectric multilayer film obtained of alternately laminated $Al_2O_3$ and $SiO_2$. Moreover, to form the low-reflection film $S_1$, it is possible to use the plasma CVD method (PCVD method) or electronic cyclotron resonance sputtering method (ECR sputtering method). Among which the ECR sputtering method is preferable because a high-reliability low-reflection film can be formed.

Then, an example of the semiconductor laser module $B_1$ of the present invention shown in FIG. 6 is described below.

The module $B_1$ has a structure in which the laser device A of the present invention already described is sealed in a package 13 while it is set to a cooling device 14 comprising a plurality of pairs of Peltier elements 14a to be described later.

A collimator lens 15a is set to the light-output facet of the laser device A, an optical fiber 16 to be described later is set to the front of the package 13 through a focusing lens 15b, and a photodiode 17 is set to the back of the laser device A.

In the module $B_1$, the cooling device 14 is set in order to absorb the heat produced during the operation of the laser device A operates and thereby moderate the heat saturation of the laser device A. This is realized by monitoring the temperature of the semiconductor laser device A with a thermistor (temperature sensor) 18 fixed in the vicinity of the semiconductor laser device A while controlling a current to be supplied to the Peltier element 14a so that the temperature indicated by the thermistor becomes constant.

In this case, the larger the difference between the temperature of the environment where the laser module $B_1$ is set and the temperature at which the semiconductor laser device A is constantly controlled (the temperature indicated by the thermistor 18), the larger a load applied to the cooling device 14. As a result, the power consumption of the cooling device 14 increases and the total power consumption of the whole laser module $B_1$ also increases.

The power consumption of the cooling device 14 under a certain operating condition (wherein the amount of heat produced by the semiconductor laser device A and environmental temperature are definite) depends on the size of the Peltier element and the characteristics thereof such as magnitude of a Seebeck coefficient, but generally it becomes larger when the number of pairs used in cooling device is smaller than 40, and the total power consumption of the module B1 also become large accordingly. Therefore, it is preferable to set the number of pairs of Peltier elements to be used to 40 or more.

In the above-described structure, by increasing the thickness of a base plate 13a made of Cu—W of a package to which the cooling device 14 comprising the Peltier element 14a is fixed, the heat discharged to a heat sink (not shown) outside of the laser module through the base plate 13a from the cooling device 14 is so diffused while passing through the base plate 13a that it is possible to lower the effective thermal impedance of the above-described heat-discharge path. Thereby, the load of the cooling device 14 is mitigated and the cooling effect is improved. Therefore, it is possible to decrease the power consumption of the cooling device 14 and stably operate the laser module $B_1$ also in a higher-temperature environment.

However, when extremely increasing the thickness of the base plate 13a, increase of the thermal impedance due to increase of the length of a heat-discharge path becomes more dominant than the reduction of a thermal impedance due to the above-described heat diffusion and thereby, the cooling effect by the cooling device 14 decreases rather.

It is preferable to set the thickness of the base plate 13a in an optimum range in such a trade-off relation.

FIG. 7 shows another semiconductor laser module $B_2$ of the present invention.

The module $B_2$ has a structure in which a cooler 14A comprising plural pairs of Peltier elements 14a and a cooler 14B comprising plural pairs of Peltier elements 14b are electrically arranged in a package 13 in parallel.

In the case of this structure, the total power consumption of the module under a certain operating condition (wherein the amount of heat produced by a semiconductor laser device 14A, temperature of a thermistor 18, and environmental temperature in which the laser module $B_2$ is set are definite) is almost equal to the case of the module $B_1$ if the total number of Peltier elements are the same. But this structure has the advantages of lowering the operating voltage of a cooler, making it possible to drive the cooler by a versatile inexpensive 5-volt power supply.

Figure 8:
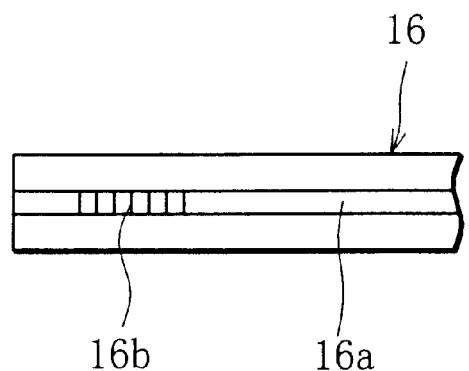
FIG. 8 is a cross-sectional view showing an optical fiber to be built in a module.

In the case of the above-described module, it is preferable to use as an optical fiber 16 to be built-in the optical fiber with a grating 16b formed on a central core 16a thereof as shown in FIG. 8. In this case, it is preferable that the reflection bandwidth of the grating 16b is 2 nm or less, particularly 1.5 nm or less and larger than the wavelength interval of the longitudinal modes of a laser beam oscillated from the laser device A.

The reason is described below.

First, the wavelength interval (Δλ) of the longitudinal mode of a laser beam oscillated from the laser device A is shown by the following equation:

$$\Delta\lambda = \lambda^2/2n \cdot L$$

(wherein λ denotes an oscillated wavelength, n denotes the effective refractive index of the active layer 4, and L denotes a cavity length.)

Then, because the cavity length (L) is longer than the cavity length of the prior art (900 μm) disclosed in the official gazette of the above-described U.S. Pat. No. 5,485,030, the wavelength interval (Δλ) in the longitudinal mode is smaller than the case of the prior art.

Therefore, in the case of this module, it is possible to include more longitudinal modes in the reflection bandwidth of the grating 16b formed on the optical fiber 16 compared to the case of the prior art. In other words, it is possible to mitigate the kinks in the light output versus injection current characteristic of a laser beam emitted from the optical fiber 16.

Moreover, in the case of this module, because the wavelength interval (Δλ) in the longitudinal modes of a laser beam oscillated of the semiconductor laser device A is narrow, it is also possible to set the reflection bandwidth of a grating to a small value of 2 nm or less without decreasing the number of longitudinal modes present in the reflection bandwidth of the grating 16b, in other words, while preventing the generation of kinks in the light output versus injection current characteristic.

Furthermore, in the case of this module, by setting the reflection bandwidth of the grating 16 to 1.5 nm or less, particularly to 1 nm or less, it is possible to completely decrease the spectral width of a laser beam emitted from the optical fiber 16. Therefore, it is possible to increase the degree of multiplexing under wavelength multiplexing and to decrease the loss of a wavelength-multiplexing coupler used.

EXAMPLE 1

(1) Fabrication of semiconductor laser device

The buried heterostructure (BH structure) shown in FIG. 5 was fabricated by forming a stacked structure on an n-InP substrate 1 by use of the MOCVD method, the structure comprising a lower clad layer 2 of n-InP, a lower GRIN-SCH layer 3 of non-doped GaInAsP, an active layer 4 of a compressed strained multi-quantum well structure having five quantum wells of a lattice-mismatching rate of +0.8% with barrier layer of GaInAsP having band gap energy of 1.0 eV, an upper GRIN-SCH layer 5 of non-doped GaInAsP, an upper clad layer 6 of p-InP, and a cap layer 7 of p-GaInAsP, and then forming a current confinement portion with a p-InP layer 11 and an n-InP layer 12.

Then, the Example device shown in FIG. 4 was fabricated by cleaving the whole structure to form various cavity lengths (L), forming a low-reflection film $S_1$ having a reflectance of 3% on one cleaved face with $Al_2O_3$ by the ECR sputtering method, and forming a high-reflection film $S_2$ having a reflectance of 98% on the other cleaved face also by the ECR sputtering method.

For comparison, a device was fabricated similarly to the case of Example except that the active layer 4 had a lattice-matching-system quantum well structure made of GaInAsP. The device was designated as Comparative example device 1.

(2) Characteristics of device

Figure 9:
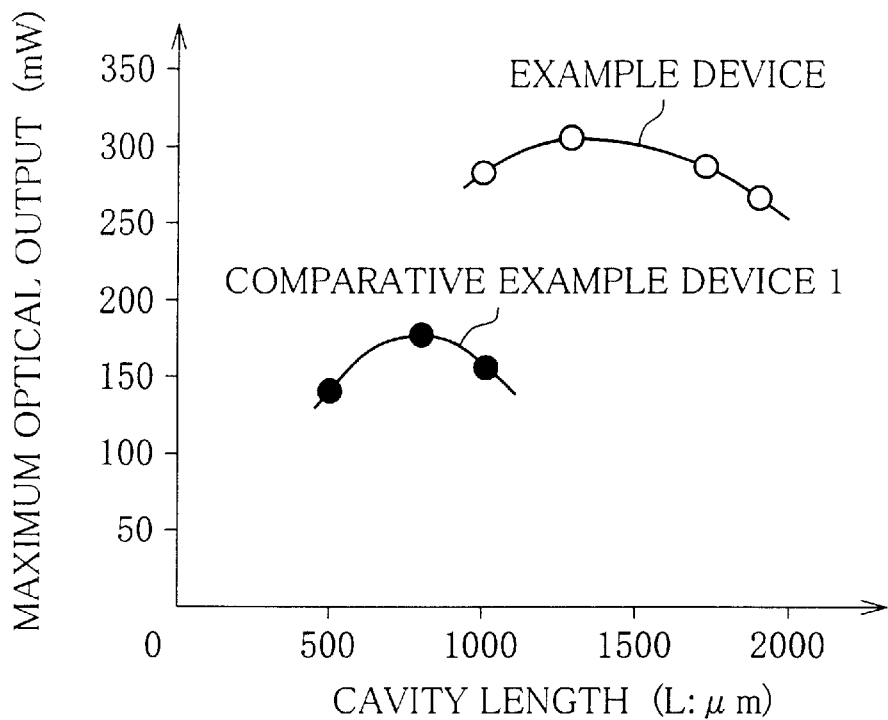
FIG. 9 is a graph showing relations between cavity lengths and maximum optical output power of a device of Example and a device 1 of Comparative example.

Maximum optical outputs of these two devices were measured while changing cavity lengths (L). FIG. 9 shows the measurement results.

As is apparent from FIG. 9, in the case of Comparative example device 1, not only the maximum optical output is low as a whole but also it is observed that the maximum optical output lowers due to internal absorption when the cavity length (L) becomes 800 μm or more. In the case of Example device, however, lowering of the optical output due to internal absorption is not observed before the cavity length (L) exceeds 1200 μm and moreover, the maximum optical output of the device is approximately 310 mW and thus, the device performs high-output operations.

(3) Influence of low-reflection film $S_1$

When the Example device was fabricated, a low-reflection film $S_1$ having a reflectance of 5% was formed while keeping the reflectance of the high-reflection film S2 at 98% to fabricate a device different in cavity length (L). The low-reflection film having a reflectance of 5% was designated as Comparative example device 2. In this case, the low-reflection film $S_1$ was formed by the PCVD method.

Maximum optical outputs of the above-described Example device and the Comparative example device 2 were measured for various cavity lengths (L). The results are shown in FIG. 10.

Figure 10:
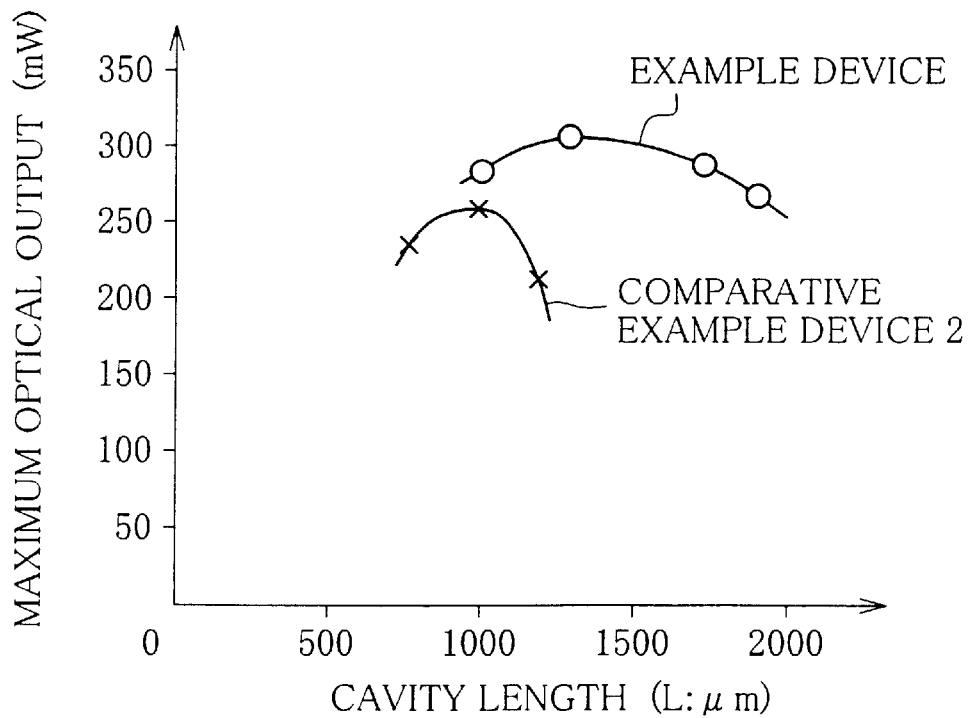
FIG. 10 is a graph showing relations between cavity lengths and maximum optical output power of a device of Example and a device 2 of Comparative example.

As is apparent from FIG. 10, even if the stacked structure is the same as that of Example device, when the reflectance of the low-reflection film $S_1$ exceeds 3%, internal absorption becomes dominant and the maximum optical output is greatly lowered.

In the case of Example device having a cavity length (L) of 1200 μm, a low-reflection film ($Al_2O_3$) $S_1$ having a reflectance of 3% was formed by the electron-beam (EB) vacuum evaporation method and ECR sputtering method respectively to perform an APC (Automatic Power Control) reliability test.

While the change rate of an operating current after operation for 1000 hours was 0.6% in the case of the former method, it was 0% in the case of the latter method.

As is apparent from the above, it is necessary to set the reflectance of the low-reflection film $S_1$ to 3% or less. In this case, it is found that the low-reflection film $S_1$ can be formed preferably by the ECR sputtering method.

EXAMPLE 2

Research and development in a Raman amplifier is recently actively performed in addition to an erbium-doped optical-fiber amplifier. In Raman amplifiers, a pumping light source having a high output in any wavelength band is requested.

Therefore, a laser device for oscillating wavelengths of 1150 to 1550 nm by changing active-layer compositions was fabricated as the Example device. The cavity length (L) of the laser device was set at 1200 μm and the facet reflectance of it was set at 3% on the low-reflection side and at 98% on the high-reflection side.

Figure 11:
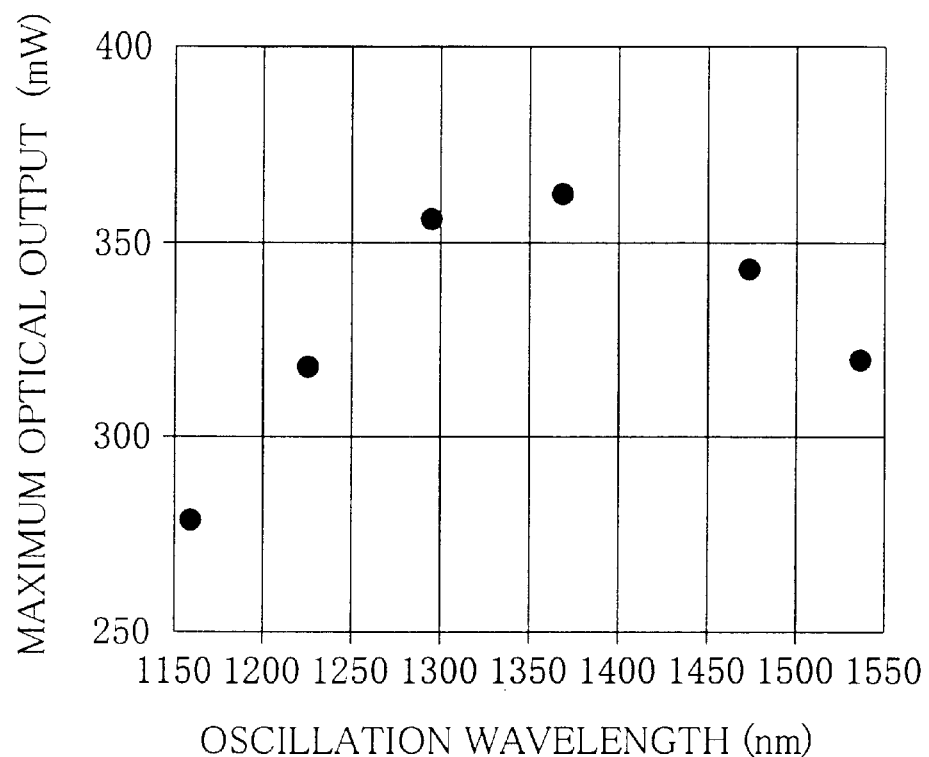
FIG. 11 is a graph showing the wavelength dependency of the maximum optical output of a semiconductor laser device of the present invention.

FIG. 11 shows the oscillated-wavelength dependency of the maximum optical output of the above-described laser device. A maximum optical output of 300 mW or more was obtained at an oscillated wavelength of 1200 to 1550 nm. However, an optical output has a tendency of lowering as the oscillated wavelength becomes shorter. This is because a heterobarrier that is an energy difference between an InP cladding layer and an optical confinement layer decreases in a short-wavelength region and thereby, a non radiative current component going over the heterobarrier height between p-InP cladding layer and upper optical confinement layer increases.

Moreover, increasing the thickness of a well layer in a quantum well structure is considered as an exemplary method to further lengthening an oscillated wavelength. In this exemplary method, however, it is estimated that the longer the wavelength, the larger the strain energy accumulated in an active layer due to increase in a well-layer thickness, thus providing a factor for crystallinity-deterioration.

A light-receiving element in an optical communication system uses a light-receiving element made of GaInAs which has an absorption end in the vicinity of 1650 nm, beyond which the light-receiving sensitivity abruptly lowers. Therefore, approximately 1650 nm is a limit as a wavelength of a signal light source at the long-wavelength side. Under such limitation, the pumping light source for a Raman amplifier necessary to amplify the signal should be a high optical output pumping light source at approximately 1550 nm which is approximately 100 nm shorter than 1650 nm.

Therefore an optical semiconductor laser device of the present invention can provide a high-output power in a wavelength band between 1200 and 1550 nm, and therefore it can be preferably applied not only to a pumping light source that oscillates in 1480 nm band for an erbium-doped optical-fiber amplifier but also to a high-output light source for a Raman amplifier.

Though the above-described Example device uses a GaInAsP-based material, it is also possible to fabricate a laser device in the above-described wavelength band by using a material such as GaInNAs or AlGaInAs.

Though the above-described Example device uses an n-InP substrate, it is also possible to obtain the same advantage by using a p-InP substrate.

EXAMPLE 3

Laser modules $B_1$ and $B_2$ shown in FIGS. 6 and 7 were assembled by using the Example device having a cavity length (L) of 1200 μm.

It should be noted that the Example device is a semiconductor laser device operating at an optical output from a facet of 280 mW for a driving voltage of 2.5 V and a driving current of 1.1 A. Therefore, the Example device has a heat generation ($Q_{LD}$) of 1.1 (A)×2.5 (V)–0.28 (≈0.3) W≈2.5 W.

In this case, a Peltier element 14a according to the following specification was used to constitute the cooling device 14.

Shape: Rectangular-parallelepiped bulk having dimensions of 0.64 mm in length, 0.64 mm in width, and 0.82 mm in height Characteristics: Seebeck coefficient of $2.0\times10^{-4}$ V/K, performance index of $2.8\times10^{-3}$/K, resistivity of $1.1\times10^{-5}$ Ωm, and heat conductivity of 1.3 W/K/m A driving current (Ic), a driving voltage (Vc), and a power consumption (Wc) of a cooler were estimated when driving the cooler while keeping the thermistor temperature at 25° C., with the amount of heat($Q_{LD}$) generated at the Example device of 2.5 Watts in an environmental temperature of 50° C. for the case of a cooler with 40 or 50 Peltier elements connected in series in the laser module of B1 shown in FIG. 6 and for the case of two coolers connected in parallel, each comprising 25 pairs of serially connected Peltier elements, in the laser module of B2 shown in FIG. 7.

The same study was performed for a case of using a cooler of the conventional design having 30 pairs of Peltier elements as Comparative example.

Table 1 shows the above results.

TABLE 1

Environmental temperature of 50° C. and thermistor temperature of 25° C.

| | Number of pairs of Peltier elements used (Pairs) | | | |
|---|---|---|---|---|
| | Laser module $B_1$ | | | Laser module $B_2$ Two modules |
| Performance | 30 pairs (Comparative example) | 40 pairs | 50 pairs | respectively having 25 pairs arranged in parallel (50 pairs in total) |
| Amount of heat generated at semiconductor laser device: $Q_{LD}$ (W) | 2.5 | 2.5 | 2.5 | 1.25 × 2 |
| Driving voltage of cooling device: Vc (V) | 3.16 | 3.38 | 3.76 | 1.80 |
| Driving current of cooling device: Ic (A) | 1.94 | 1.47 | 1.26 | 1.33 × 2 |
| Power consumption of cooling device: Wc = Vc × Ic(W) | 6.12 | 4.96 | 4.73 | 4.78 |
| Total power consumption of laser modules $Q_{LD}$ + Wc (W) | 8.62 | 7.46 | 7.23 | 7.28 |

Figure 12:
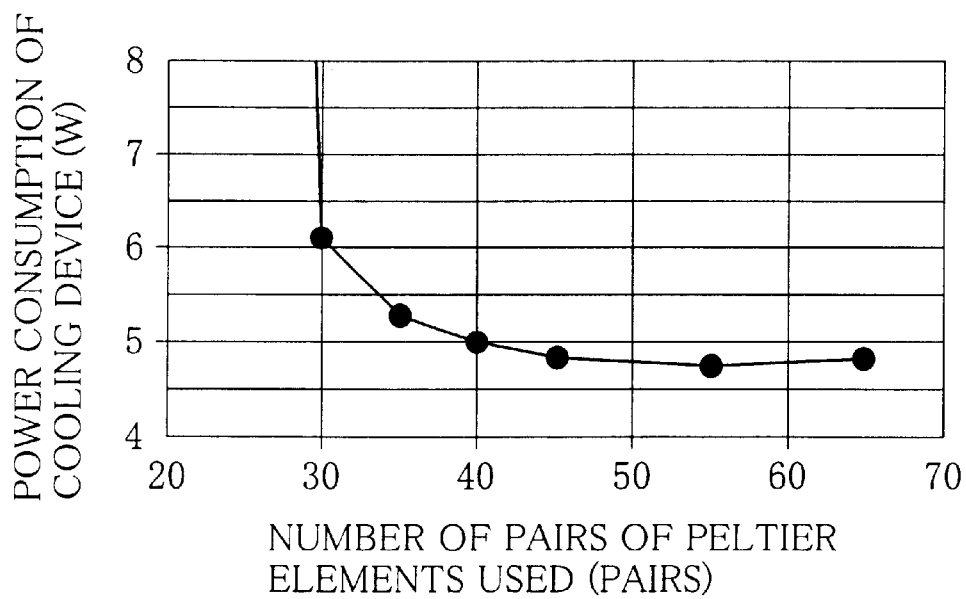
FIG. 12 is a graph showing the relation between the number of pairs of Peltier elements used and the Peltier power consumption in a laser module.

The following are clarified from FIG. 12 and Table 1.

(1) When the number of pairs of Peltier elements is smaller than 40, the driving current and power consumption of the cooling device increase in both laser modules $B_1$ and $B_2$ and the total power consumption of the laser modules also increases.

(2) On the other hand, when the number of pairs of Peltier elements exceeds 40, the driving voltage of the cooling device rises but the power consumption of the cooling device and the total power consumption of modules decrease. The power consumption is improved by 1 W or more for both cases of 40 pairs and 50 pairs compared to the case of using 30 pairs.

Figure 13:
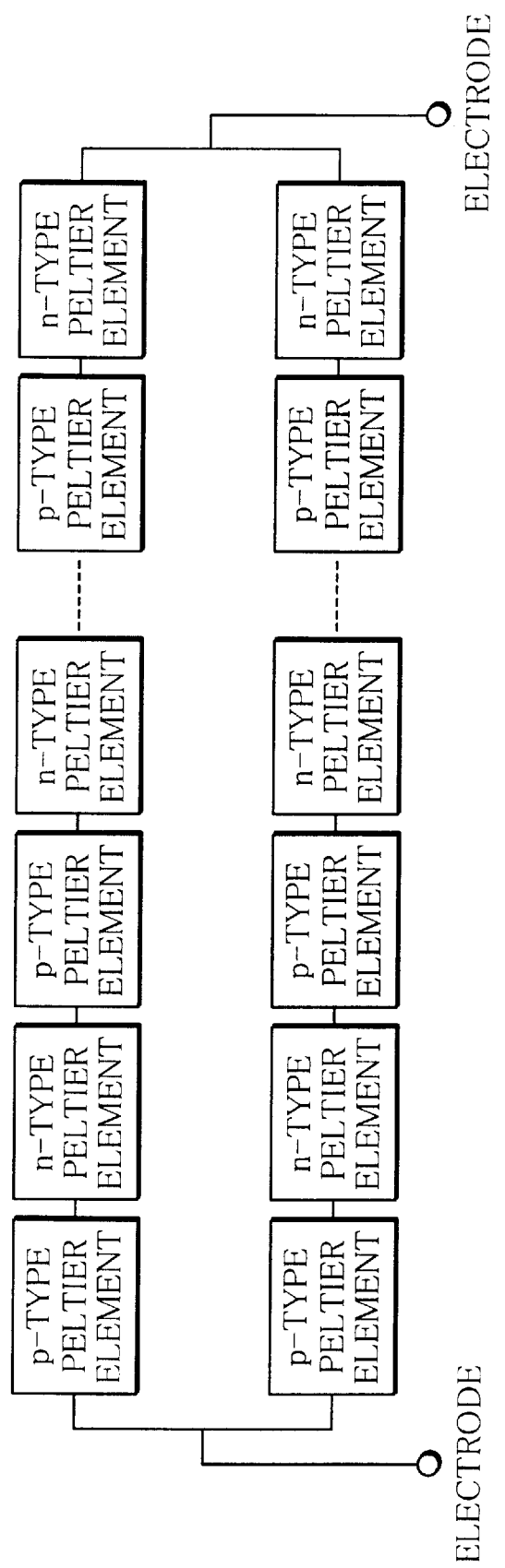
FIG. 13 is an illustration showing an electrical connection of Peltier elements in a cooler used for a laser module of Example 2.

(3) When the number of Peltier elements connected in series is increased, series resistance increases. Therefore, particularly, when a laser module is operated under a high-temperature environment, a problem occurs that voltage drops at both ends of a cooler increase and thereby, a versatile inexpensive 5-volt power supply cannot be used. Therefore, by operating two coolers connected in parallel as shown in Table 1 and FIG. 7, each cooler comprising 25 pairs of Peltier elements connected in series, the power consumption of the cooling device and the total power consumption of the modules result in the same advantage as the case of operating one cooler comprising 50 pairs of Peltier elements. Moreover, also by using a cooler as shown in FIG. 13 wherein each half of the Peltier elements in one cooler is electrically connected in series so that p-type and n-type elements are alternate and wherein these series are electrically arranged in parallel, it is possible to drive the cooler at a lower voltage without lowering the cooling performance of the cooling device, and therefore to drive the cooler by a versatile inexpensive 5-volt power supply.

When two coolers are used, Peltier elements may be electrically arranged in parallel in at least one of the coolers.

Then, a laser module using a cooler comprising 30 pairs of Peltier elements which is Comparative example (conventional example) and a laser module using a cooler comprising 50 pairs of Peltier elements were fabricated. Semiconductor laser devices used for the above-described laser modules are semiconductor laser devices respectively having a cavity length of 1200 μm shown for Examples 1, 2, and 3. For these laser modules, power consumption of the cooler when controlled so that the temperature indicated by the thermistor 18 is kept at 25° C. at an environmental temperature of 65° C. were examined by changing amount of heat generated at a semiconductor laser device. The results are shown in FIG. 14.

Figure 14:
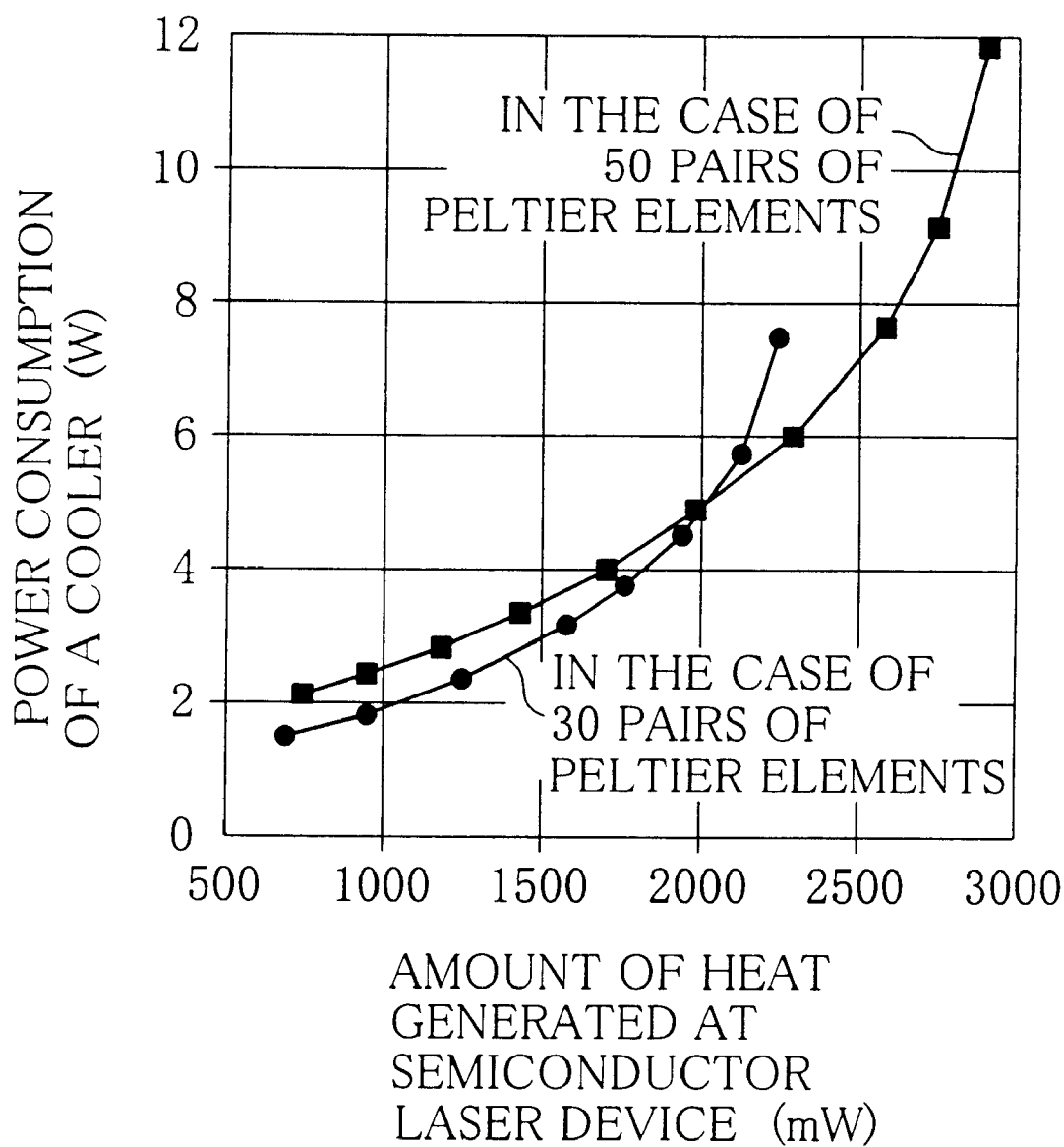
FIG. 14 is a graph showing the relation between the amount of heat generated at a semiconductor laser device and the power consumption of a cooler in a semiconductor laser module fabricated for Example 2.

As is apparent from FIG. 14, in the case of the laser module using the cooler comprising 30 pairs of Peltier elements, it was impossible to discharge the generated heat in the region where the amount of heat generated at a semiconductor laser device was 2.25 W or more. On the other hand, in the case of the laser module using the cooler comprising 50 pairs of Peltier elements, the power consumption was kept lower than the case of the comparative example in the region where the amount of heat generated was 2 W or more. Moreover, the laser module had a sufficient cooling performance even for an amount of heat generated of 2.5 W and made it possible to cool a semiconductor laser device up to an amount of heat generated of 2.9 W or more. Therefore, in order to cool a semiconductor laser device of the present invention in a particularly high optical output region, it is preferable to use a cooler comprising 40 pairs or more of Peltier elements shown in this Example.

In this Example, Peltier elements respectively having a length of 0.64 mm and a width of 0.64 mm were used. The size of a Peltier element is not restricted to such dimensions. That is, in the case of a cooler comprising 40 pairs of Peltier elements, the total cross-sectional area of Peltier elements contributing to heat discharge (in the case of the present invention, the cross-sectional area is referred to as "heat-discharge cross-sectional area") is 0.64 (mm)×0.64 (mm)× 40 (pairs)×2=32.8 mm². Therefore, it is clear that a cooler having a heat-discharge cross-sectional area of approximately 30 mm² or more shows the advantage of the present invention even if it comprises less than 40 pairs of Peltier elements.

Figure 1:
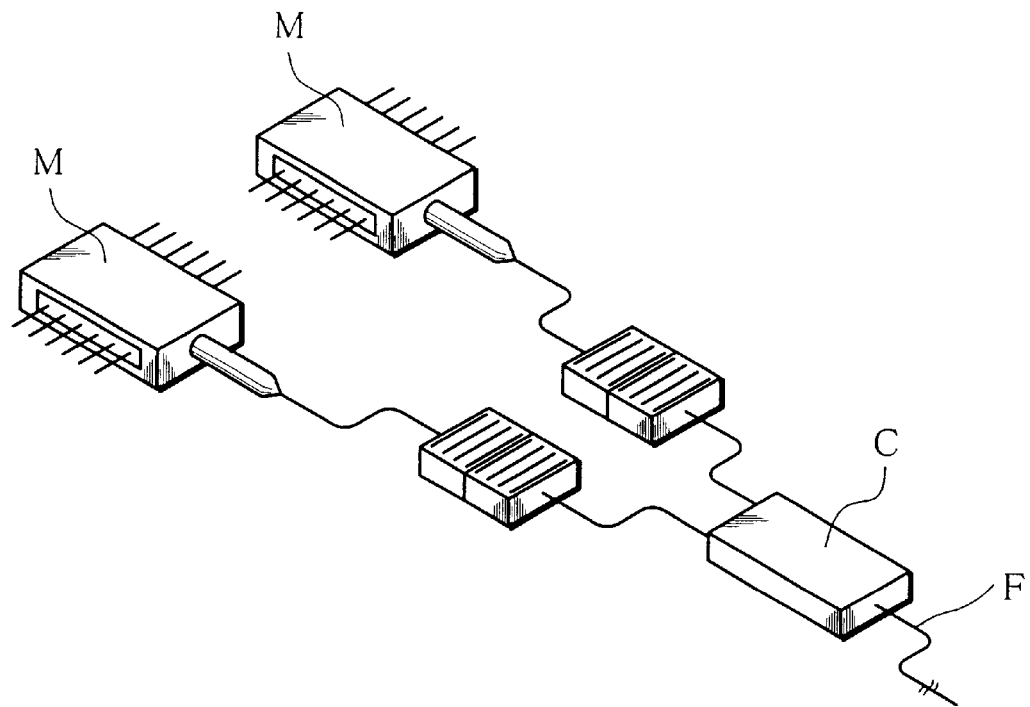
FIG. 1 is a schematic view showing a light source for pumping an optical-fiber amplifier.

Then, two optical-fiber amplifier pumping light sources each having the optical output of 250 mW from each fiber output end are fabricated by using one laser module $B_1$ of Example 3 and by using two laser modules each having a cooler comprising Peltier elements and an optical-fiber output of 140 mW shown in FIG. 1. Table 2 shows operational specifications of both light sources at an environmental temperature of 50° C. and a thermistor temperature of 25° C. respectively.

TABLE 2

|  | Pumping light source using module of Example 2 | Pumping light source in FIG. 1 using the conventional module |
|---|---|---|
| Optical output from fiber output end (mW) | 280 | 252 |
| Cavity length of laser (μm) | 1200 | 800 |
| Laser driving current (mA) | 1100 | 700 × 2 |

TABLE 2-continued

|  | Pumping light source using module of Example 2 | Pumping light source in FIG. 1 using the conventional module |
|---|---|---|
| Laser driving voltage (V) | 2.5 | 2.3 |
| Laser driving power (W) | 2.75 | 3.22 |
| Number of pairs of Peltier elements used (Pairs) | 50 | 30 |
| Power consumption of cooling device (W) | 4.73 | 5.48 |
| Total power consumption (driving power) of laser modules (W) | 7.23 | 8.38 |
| Energy conversion efficiency (%)* | 3.87 | 3.00 |

*Energy conversion efficiency = Optical output from optical-fiber output end × 100/total power consumption (driving power) of laser modules As is apparent from Table 2, the total power consumption of system with the pumping light source operated at more than required 250 mW of optical output from fiber output end is smaller for the case with single laser module of Example 2 than for the conventional case.

Then, temperatures of active layers of semiconductor laser devices of laser modules constituting the above-described optical-fiber-amplifier pumping light sources were compared and failure rates of both systems were calculated when assuming that the above-described optical-fiber-amplifier pumping light sources had the same activation energy (Ea) for wear-out failure of semiconductor laser devices. The results are shown in Table 3.

The thermal impedance in Table 3 shows the thermal impedance between a semiconductor laser device and a thermistor when keeping the thermistor temperature at 25° C. In Example 2, the thermal impedance shows 12 (K/W) which is 2/3 of the thermal impedance of Comparative example. This is because the cavity length of a semiconductor laser device of Example 2 is 1200 μm and thereby, the heat-discharge area increases compared to the case of the semiconductor laser device of Comparative example having a cavity length of 800 μm. In this case, the temperature Tj(K) of the active layer of the semiconductor laser device is calculated by the following expression.

$$Tj(K) = \text{Thermistor temperature } (25° C.) + 273(K) + \text{Thermal impedance } (W/K) \times \text{Amount of heat generated at laser } (W)$$

Therefore, in the case of Example 2, Tj(K) is calculated as follows.

$$Tj(K) = 25(°C.) + 273(K) + 12(K/W) \times 2.45(W) = 327(K)$$

In the case of Comparative example, TJ(K) is calculated similarly as follows.

$$Tj(K) = 25(°C.) + 273(K) + 8(K/W) \times 1.45(W) = 324(K)$$

When both cases are compared, it is found that the amount of heat generated at laser of Example 2 is approximately 1.7 times larger than that of Comparative example but temperatures of active layers of Example 2 and Comparative example are almost equal to each other. Therefore, it is possible to prevent a temperature rise of an active layer by increasing the cavity length.

Moreover, a failure rate of a laser module is shown by the following expression.

Laser-module failure rate (*FIT*)=Laser wear-out failure rate (*FIT*)+ Laser random failure rate (*FIT*)+failure rate of coupling-system (*FIT*)

Moreover, the total failure rate of the optical-fiber-amplifier pumping light source is shown by the following expression.

Total failure rate (FIT)=Laser-module failure rate (FIT)×(Number of laser modules to be constituted)

Therefore, as is apparent from Table 3, a pumping light source of high-reliability is realized with the 250 mW-pumping light source for optical-fiber amplifier as configured in Example 2 since the total failure rate thereof is 1960FIT, being approximately 50% of that of the pumping light source wherein 2 of the conventional laser module (140 mW) are used.

It is needless to say that the present invention is advantageous in respect of the total failure rate as the number of laser modules to be constituted increases.

TABLE 3

|  | Pumping light source using Example 2 | Pumping light source in FIG. 1 using conventional laser module (Comparative example) |
| --- | --- | --- |
| Thermal impedance (K/W) | 12 | 18 |
| Amount of heat generated at laser (W) | 2.45 | 1.45 |
| Active layer temperature (Tj: K) | 327 | 324 |
| Activation energy (Ea: eV) | 0.62 | 0.62 |
| Laser wear-out failure rate (FIT) | 284 | 98 |
| Laser random failure rate (FIT) | 284 | 284 |
| Failure rate of coupling-system (FIT) | 1400 | 1400 |
| Laser-module failure rate (FIT) | 1968 | 1782 |
| Total failure rate (FIT) | 1968 | 3564 |

Moreover, a cooler comprising 50 pairs of Peltier elements was used for the laser module $B_1$ shown in FIG. 6, and driving conditions (driving current of the semiconductor laser device, temperature of the thermistor, and driving current of the cooler) of the laser module $B_1$ was set so that the amount of heat transmitted from the lower portion of the cooler to the base plate 13a made of Cu—W was 10 W. In this case, the temperature at the lower face of the base plate 13a, that is, the temperature of an unillustrated heat sink to which the laser module $B_1$ is fixed was controlled to be kept at 20° C. Under the above-described state, temperatures of the lower face of the cooler, that is, temperatures of the upper face of the base plate 13a were measured for various thickness of the base plate 13a below the cooler.

As Comparative example, a base plate having the thickness of 1 mm of the conventional structure was measured similarly. The results are shown in Table 4.

TABLE 4

| Thickness of base plate (mm) | Temperature of upper face of base plate (° C.) (Temperature of lower face is kept constant at 20° C.) |
| --- | --- |
| 0.1 | 52.38 |
| 1 Comparative example | 50.22 |
| 2 | 47.8 |
| 3 | 47.16 |

TABLE 4-continued

| Thickness of base plate (mm) | Temperature of upper face of base plate (° C.) (Temperature of lower face is kept constant at 20° C.) |
| --- | --- |
| 5 | 46.97 |
| 10 | 47.55 |
| 15 | 48.37 |

From Table 4, the following can be found. That is, by increasing the thickness of the base plate 13a starting with 0.1 mm, the difference between the temperature of the upper face of and the temperature of the lower face (constant at 20° C.) of the base plate decreases. However, when the thickness of the base plate becomes 10 mm or more, the temperature difference increases rather. The reason why the temperature difference between the upper and lower faces of the base plate shows such tendency can be thought as follows. That is, by increasing the thickness of the Cu—W base plate 13a, the heat discharged from the lower face of the cooler through the base plate 13a to a heat sink (not shown) outside of the laser module diffuses while passing through the base plate 13a and therefore, it is possible to decrease the effective thermal impedance of the above-described heat-discharge path. However, by extremely increasing the thickness of the base plate 13a, increase in the thermal impedance due to increase in the length of the heat-discharge path becomes dominant over the reduction effect of the effective thermal impedance due to above-described heat diffusion. It is preferable that the thickness of the base plate 13a is decided in an optimum range in the trade-off relation. Specifically, it is preferable to set the thickness of base plate 13a in a range of 3 to 10 mm. A laser module in which the thickness of the base plate 13a is selected in the above-described range can be driven at a low power consumption because the temperature difference between the upper and lower faces of a base plate is small and thereby, the load on a cooler is reduced.

EXAMPLE 4

Three types of semiconductor laser devices having cavity lengths (L) of 1000, 1300, and 1800 μm and structures shown in FIGS. 4 and 5 are fabricated similarly to the case of Example 1. Moreover, the optical fibers shown in FIG. 8 were prepared in which gratings with reflection bandwidths of 1, 1.5, and 2 nm were formed. Then, modules shown in FIG. 6 were fabricated by combining them. Spectral widths of laser beams emitted from the optical fibers were measured by driving these modules. Moreover, longitudinal-mode wavelength intervals (Δλ) of the semiconductor laser devices and the number of longitudinal modes present in reflection bandwidth of the gratings were calculated.

Table 5 collectively shows both the measurement and calculation results. Reflectances of the gratings used were respectively set to 5%.

TABLE 5

|  | Cavity length of laser device (L: μm) | | |
| --- | --- | --- | --- |
|  | 1000 | 1300 | 1800 |
| Longitudinal-mode wavelength interval of semiconductor laser device (Δλ: nm) | 0.31 | 0.24 | 0.17 |

TABLE 5-continued

|  |  | Cavity length of laser device (L: μm) | | |
| --- | --- | --- | --- | --- |
|  |  | 1000 | 1300 | 1800 |
| Number of longitudinal modes present in reflection band of grating*1 | Reflection bandwidth of grating: 1 nm | 3.2 | 4.2 | 5.8 |
|  | Reflection bandwidth of grating: 1.5 nm | 4.8 | 6.2 | 8.6 |
|  | Reflection bandwidth of grating: 2 nm | 6.4 | 8.4 | 11.6 |
| Spectral width of light emitted from laser module*2 (nm) | Reflection bandwidth of grating: 1 nm | 1.0 | 0.8 | 0.5 |
|  | Reflection bandwidth of grating: 1.5 nm | 1.2 | 1.0 | 0.7 |
|  | Reflection bandwidth of grating: 2 nm | 1.6 | 1.2 | 1.0 |

Figure 2:
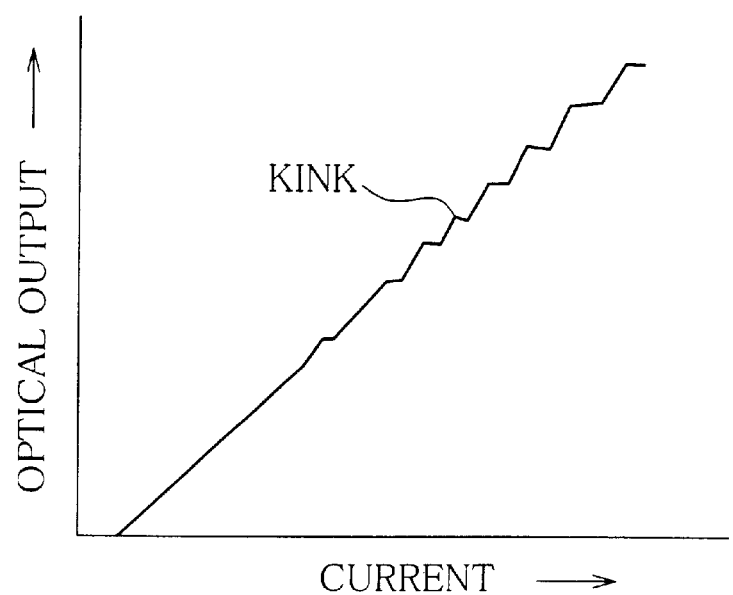
FIG. 2 is a graph showing the light output versus injection current characteristic of a conventional semiconductor laser module having an optical fiber with a grating.
Figure 3:
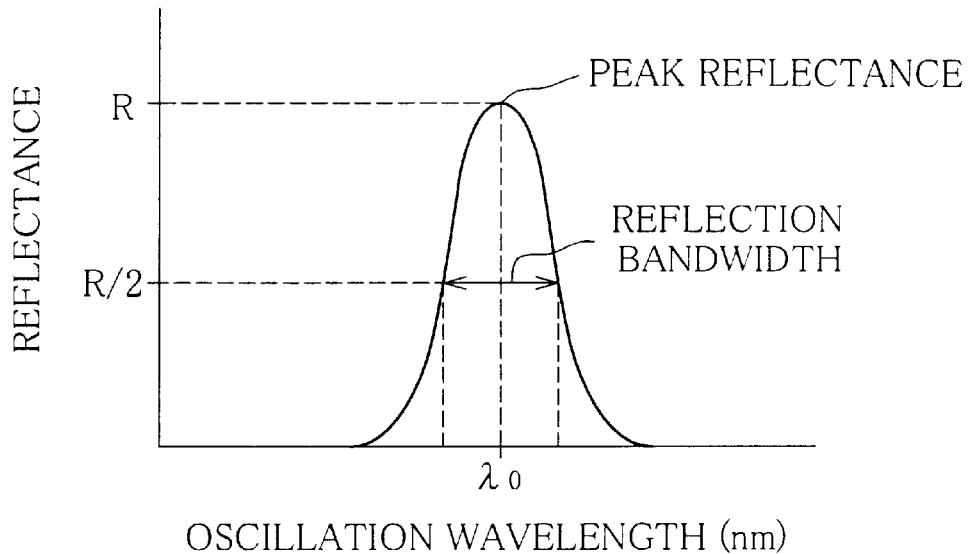
FIG. 3 is an illustration for explaining a reflection bandwidth of an optical fiber with a grating.

*1: Defined by (Reflection bandwidth of grating: nm)/(Longitudinal mode interval of semiconductor laser device: nm)
*2: Wavelength width where intensity of reflectance spectrum lowers from peak intensity by 10 dB The light output versus injection current characteristic measurement done for any of semiconductor laser modules corresponding to design parameter shown in Table 5 showed no kinks like in FIG. 2.

The following are clarified from these results.

That is, increasing the cavity length of the semiconductor laser device to 1,000 μm or more reduces the longitudinal-mode wavelength interval Δλ of a semiconductor laser device, thereby making it possible to increase the number of longitudinal modes present in the reflection bandwidth of a grating compared to the laser of conventional number of longitudinal modes. Therefore, the number of longitudinal modes present in the reflection bandwidth of the grating can be enough to prevent generation of kinks in light output versus injection current characteristics even when the-reflection bandwidth of the grating is set to a small value of 2 nm or less.

Therefore, in the present invention having a semiconductor laser device whose cavity length ranges between 1000 and 1800 μm and a grating whose reflection bandwidth is 2 nm or less and larger than the longitudinal-mode wavelength interval of the semiconductor laser device, the following advantages can be obtained: (1) the light output from a semiconductor laser device is increased; and moreover (2) generation of kinks in the light output versus injection current characteristic is controlled because a plurality of longitudinal modes are always present in the reflection band of the grating; and (3) it is possible to decrease the spectral width of a laser beam emitted from an optical fiber can be narrowed because the reflection bandwidth of the grating is 2 nm or less.

Therefore, a coupling loss when multiplexing laser beams from semiconductor laser modules by use of a wavelength-multiplexing couplers can be lowered, thus is provided a semiconductor laser module capable of augmenting a degree of multiplexing and therefore suitable for obtaining higher output by wavelength-multiplexing.

Moreover, as is apparent from Table 5, even when the reflection bandwidth of a grating is set to 1.5 nm or less, the number of longitudinal modes enough to prevent generation of kinks in the light output versus injection current characteristic is present in the reflection bandwidth of a grating and thereby, it is possible to greatly decrease the spectral width of the light emitted from a semiconductor laser module while preventing generation of the kinks. Particularly, when setting the reflection bandwidth of a grating to 1.5 nm or less and the cavity length of a semiconductor laser device to 1300 μm or more or when setting the cavity length to 1000 μm or more and the reflection bandwidth of the grating to 1 nm or less, it is possible to greatly decrease the spectral width of the light emitted from an optical fiber to 1.0 nm or less in any case. Therefore, it is possible to fabricate a semiconductor laser module which is further preferable to obtain a higher output by wavelength multiplexing.

Industrial Applicability

The semiconductor laser device of the present invention hardly causes deterioration in an output due to internal absorption. Therefore, it can be driven at a high output and thus it is useful as a high-output light source for optical-fiber amplification.

Moreover, with the semiconductor module of the present invention fabricated by using the semiconductor laser device, the total power consumption for driving can be small and the failure rate of a system in which the laser module is built can be halved compared to the conventional system failure rate, so the reliability is improved.

Furthermore, because of a high optical output obtained from a laser module of the present invention, it is possible to substitute single module for a plurality of laser modules used being wavelength-multiplexed or polarization-multiplexed. Therefore, with a laser module of the present invention, it is possible to decrease the number of optical parts used for an optical-fiber amplifier and realize a low-cost and compact pumping light source.

Moreover, by using an optical fiber in which a grating having a reflection bandwidth of 2 nm or less, particularly 1.5 nm or less when the module is fabricated, it is possible to decrease the spectral width of a laser beam emitted from the optical fiber. Thus can be provided a pumping light source having a small loss when wavelength-multiplexed by use of a wavelength-multiplexing coupler with a narrow transmission band and thereby having a higher optical output compared to a conventional light source.

Thus, according to the present invention, it is possible to provide a compact, inexpensive, but high-output optical-fiber amplifier when constituting an optical-fiber amplifier such as an erbium-doped optical-fiber amplifier or Raman amplifier.

What is claimed is:

1. A semiconductor laser device comprising:
   a resonator cavity having a first facet and a second facet, and comprising a cavity portion between the first and second facets, the cavity portion having a length greater than or equal to 1000 μm and less than or equal to 1800 μm and a width along the entire length that can only support a single transverse mode;
   a semiconductor stacked structure including an active layer having a strained multi-quantum well structure, said stacked structure being formed on a substrate and disposed in said cavity portion; and
   a low-reflection film having a reflectance of 3% or less is formed on one facet and a reflection film having a reflectance of 90% or more is formed on the other facet.

2. The semiconductor laser device according to claim 1, wherein the strained multi-quantum well structure is a compressed strained multi-quantum well structure having a degree of 0.5 to 1.5% of lattice mismatching.

3. The semiconductor laser device according to claim 1, wherein the substrate comprises InP and the active layer comprises GaInAsP.

4. The semiconductor laser device according to claim 1 wherein the strained multi-quantum well structure comprises a compressed strained multi-quantum well structure having a degree of 0.5 to 1.5% of lattice mismatching; and wherein the substrate comprises InP and the active layer comprises GaInAsP.

5. The semiconductor laser device according to claim 1, wherein the active layer includes 3 to 5 quantum wells.

6. The semiconductor laser device according to claim 1, wherein the strained multi-quantum well structure comprises a compressed strained multi-quantum well structure having a degree of 0.5 to 1.5% of lattice mismatching; and
wherein the active layer includes 3 to 5 quantum wells.

7. The semiconductor laser device according to claim 1, wherein the strained multi-quantum well structure comprises a compressed strained multi-quantum well structure having a degree of 0.5 to 1.5% of lattice mismatching;
wherein the substrate comprises InP and the active layer comprises GaInAsP; and
wherein the active layer includes 3 to 5 quantum wells.

8. The semiconductor laser device according to claim 1, wherein the low-reflection film comprises an $Al_2O_3$ film or a dielectric multilayer film formed by the electron-cyclotron-resonance sputtering method.

9. The semiconductor laser device according to claim 1, wherein the strained multi-quantum well structure comprises a compressed strained multi-quantum well structure having a degree of 0.5 to 1.5% of lattice mismatching; and
wherein the low-reflection film comprises an $Al_2O_3$ film or a dielectric multilayer film formed by the electron-cyclotron-resonance sputtering method.

10. The semiconductor laser device according to claim 1, wherein the strained multi-quantum well structure comprises a compressed strained multi-quantum well structure having a degree of 0.5 to 1.5% of lattice mismatching;
wherein the substrate comprises InP and the active layer comprises GaInAsP; and
wherein the low-reflection film comprises an $Al_2O_3$ film or a dielectric multilayer film formed by the electron-cyclotron-resonance sputtering method.

11. The semiconductor laser device according to claim 1, wherein the strained multi-quantum well structure comprises a compressed strained multi-quantum well structure having a decree of 0.5 to 1.5% of lattice mismatching;
wherein the substrate comprises InP and the active layer comprises GaInAsP;
wherein the active layer includes 3 to 5 quantum wells; and
wherein the low-reflection film comprises an $Al_2O_3$ film or a dielectric multilayer film formed by the electron-cyclotron-resonance sputtering method.

12. The semiconductor laser device according to claim 1, wherein the wavelength band of an oscillated laser beam ranges between 1200 nm and 1550 nm.

13. The semiconductor laser device according to claim 1, wherein the strained multi-quantum well structure comprises a compressed strained multi-quantum well structure having a degree of 0.5 to 1.5% of lattice mismatching; and
wherein the wavelength band of an oscillated laser beam ranges between 1200 nm and 1550 nm.

14. The semiconductor laser device according to claim 1, wherein the strained multi-quantum well structure comprises a compressed strained multi-quantum well structure having a degree of 0.5 to 1.5% of lattice mismatching;
wherein the substrate comprises InP and the active layer comprises GaInAsP; and
wherein the wavelength band of an oscillated laser beam ranges between 1200 nm and 1550 nm.

15. The semiconductor laser device according to claim 1, wherein the strained multi-quantum well structure comprises a compressed strained multi-quantum well structure having a decree of 0.5 to 1.5% of lattice mismatching;
wherein the substrate comprises InP and the active layer comprises GaInAsP;
wherein the active layer includes 3 to 5 quantum wells; and
wherein the wavelength band of an oscillated laser beam ranges between 1200 nm and 1550 nm.

16. The semiconductor laser device according to claim 1, wherein the strained multi-quantum well structure comprises a compressed strained multi-quantum well structure having a degree of 0.5 to 1.5% of lattice mismatching;
wherein the substrate comprises InP and the active layer comprises GaInAsP;
wherein the active layer includes 3 to 5 quantum wells;
wherein the low-reflection film comprises an $Al_2O_3$ film or a dielectric multilayer film formed by the electron-cyclotron-resonance sputtering method; and
wherein the wavelength band of an oscillated laser beam ranges between 1200 nm and 1550 nm.

17. A semiconductor laser module comprising:
the semiconductor laser device according to any one of claim 1, 2, 3, 4, 12, 13, or 14 sealed in a package while being set on a cooling device comprising Peltier elements; and
an incident distal end surface of an optical fiber being located opposed to the output facet of the semiconductor laser device.

18. A semiconductor laser module comprising:
the semiconductor laser device according to claim 1 sealed in a package while being set on a cooling device comprising Peltier elements;
an incident distal end surface of an optical fiber being located opposed to the output facet of the semiconductor laser device; and
wherein the cooling device comprises at least two coolers, each cooler respectively comprising a plurality of pairs of Peltier elements, said coolers being arranged in parallel.

19. A semiconductor laser module comprising:
the semiconductor laser device according to claim 1 sealed in a package while being set on a cooling device comprising Peltier elements;
an incident distal end surface of an optical fiber being located opposed to the output facet of the semiconductor laser device; and
wherein the Peltier elements of the cooling device are divided into two groups, wherein the elements of each group are electrically coupled in series to form a series circuit, and wherein the series circuits of the two groups are electrically coupled in parallel.

20. A semiconductor laser module comprising:
the semiconductor laser device according to claim 1 sealed in a package while being set on a cooling device comprising Peltier elements;
an incident distal end surface of an optical fiber being located opposed to the output facet of the semiconductor laser device; and
wherein the cooling device comprises 40 pairs or more of Peltier elements.

21. A semiconductor laser module comprising:
the semiconductor laser device according to claim 1 sealed in a package while being set on a cooling device comprising Peltier elements;

an incident distal end surface of an optical fiber being located opposed to the output facet of the semiconductor laser device;

wherein the Peltier elements of the cooling device are divided into two groups, wherein the elements of each group are electrically coupled in series to form a series circuit, and wherein the series circuits of the two groups are electrically coupled in parallel; and wherein the cooling device comprises 40 pairs or more of Peltier elements.

22. A semiconductor laser module comprising:

the semiconductor laser device according to claim 1 sealed in a package while being set on a cooling device comprising Peltier elements;

an incident distal end surface of an optical fiber being located opposed to the output facet of the semiconductor laser device; and wherein the Peltier elements have a heat-discharge cross-sectional area of 30 mm² or more.

23. A semiconductor laser module comprising:

the semiconductor laser device according to claim 1 sealed in a package while being set on a cooling device comprising Peltier elements;

an incident distal end surface of an optical fiber being located opposed to the output facet of the semiconductor laser device; and wherein the package comprises a base plate serving as the bottom plate of the package, said base plate having a thickness of 3 mm to 10 mm.

24. A semiconductor laser module comprising:

the semiconductor laser device according to claim 1, 2, 4, or 14 sealed in a package while being set on a cooling device comprising Peltier elements;

an incident distal end surface of an optical fiber being located opposed to the output facet of the semiconductor laser device; and a grating having a reflection bandwidth of 2 nm or less but larger than the longitudinal-mode wavelength interval of the laser beam oscillated from the semiconductor laser device formed on the optical fiber.

25. A semiconductor laser module comprising:

the semiconductor laser device according to claim 1, 2, 4, or 14 sealed in a package while being set on a cooling device comprising Peltier elements;

an incident distal end surface of an optical fiber being located opposed to the output facet of the semiconductor laser device;

a grating having a reflection bandwidth of 2 nm or less but larger than the longitudinal-mode wavelength interval of the laser beam oscillated from the semiconductor laser device formed on the optical fiber; and wherein a laser beam emitted from the optical fiber has a spectral width of 1 nm or less.

26. A semiconductor laser module comprising:

the semiconductor laser device according to claim 1, 2, 4, or 14 sealed in a package while being set on a cooling device comprising Peltier elements;

an incident distal end surface of an optical fiber being located opposed to the output facet of the semiconductor laser device; and wherein an optical output of the optical fiber is 180 mW or more.

27. A semiconductor laser module comprising:

the semiconductor laser device according to claim 1, 2, 4, or 14 sealed in a package while being set on a cooling device comprising Peltier elements;

an incident distal end surface of an optical fiber being located opposed to the output facet of the semiconductor laser device;

a grating having a reflection bandwidth of 2 nm or less but larger than the longitudinal-mode wavelength interval of the laser beam oscillated from the semiconductor laser device formed on the optical fiber; and wherein an optical output of the optical fiber is 180 mW or more.

28. A semiconductor laser module comprising:

the semiconductor laser device according to claim 1, 2, 4, or 14 sealed in a package while being set on a cooling device comprising Peltier elements;

an incident distal end surface of an optical fiber being located opposed to the output facet of the semiconductor laser device; and a grating having a reflection bandwidth of 2 nm or less but larger than the longitudinal-mode wavelength interval of the laser beam oscillated from the semiconductor laser device formed on the optical fiber; and wherein a laser beam emitted from the optical fiber has a spectral width of 1 nm or less; and wherein an optical output of the optical fiber is 180 mW or more.

29. A semiconductor laser device comprising:

a resonator cavity having a first facet and a second facet, and comprising a cavity portion between the first and second facets, the cavity portion having a length greater than or equal to 1000 μm and less than or equal to 1800 μm, wherein the width of the cavity portion at each point along the length of the cavity portion can only support a single transverse mode;

a semiconductor stacked structure including an active layer having a strained multi-quantum well structure, said stacked structure being formed on a substrate and disposed in said cavity portion; and a low-reflection film having a reflectance of 3% or less is formed on one facet and a reflection film having a reflectance of 90% or more is formed on the other facet.

30. The semiconductor laser device according to claim 29 wherein the strained multi-quantum well structure is a compressed strained multi-quantum well structure having a degree of 0.5 to 1.5% of lattice mismatching.

31. The semiconductor laser device according to claim 29, wherein the substrate comprises InP and the active layer comprises GaInAsP.

32. The semiconductor laser device according to claim 29, wherein the active layer includes 3 to 5 quantum wells.

33. The semiconductor laser device according to claim 29, wherein the low-reflection film comprises an $Al_2O_3$ film or a dielectric multilayer film formed by the electron-cyclotron-resonance sputtering method.

34. The semiconductor laser device according to claim 29, wherein the wavelength band of an oscillated laser beam ranges between 1200 nm and 1550 nm.

35. A semiconductor laser module comprising:

the semiconductor laser device according to claim 29 sealed in a package while being set on a cooling device comprising Peltier elements;

an incident distal end surface of an optical fiber being located opposed to the output facet of the semiconductor laser device; and wherein the cooling device comprises at least two coolers, each cooler respectively comprising a plurality of pairs of Peltier elements, said coolers being arranged in parallel.

36. A semiconductor laser module comprising:

the semiconductor laser device according to claim 29 sealed in a package while being set on a cooling device comprising Peltier elements;

an incident distal end surface of an optical fiber being located opposed to the output facet of the semiconductor laser device; and wherein the cooling device comprises 40 pairs or more of Peltier elements.

37. A semiconductor laser module comprising:

the semiconductor laser device according to claim 29 sealed in a package while being set on a cooling device comprising Peltier elements;

an incident distal end surface of an optical fiber being located opposed to the output facet of the semiconductor laser device; and wherein the Peltier elements have a heat-discharge cross-sectional area of 30 mm$^2$ or more.

38. A semiconductor laser module comprising:

the semiconductor laser device according to claim 29 sealed in a package while being set on a cooling device comprising Peltier elements;

an incident distal end surface of an optical fiber being located opposed to the output facet of the semiconductor laser device; and wherein an optical output of the optical fiber is 180 mW or more.

39. A semiconductor laser module comprising:

the semiconductor laser device according to claim 29 sealed in a package;

an incident distal end surface of an optical fiber being located opposed to the output facet of the semiconductor laser device;

a grating having a reflection bandwidth of 2 nm or less but larger than the longitudinal-mode wavelength interval of the laser beam oscillated from the semiconductor laser device formed on the optical fiber; and wherein an optical output of the optical fiber is 180 mW or more.

40. A semiconductor laser device comprising:

a resonator cavity having a first facet and a second facet, and comprising a cavity portion between the first and second facets, the cavity portion having a length greater than or equal to 1000 $\mu$m and less than or equal to 1800 $\mu$m, and a width along the entire length that can only support a single transverse mode;

a semiconductor stacked structure formed on a substrate and disposed in said cavity portion, said stacked structure including a pair of GRIN-SCH layers and an active layer having a strained multi-quantum well structure; and a low-reflection film having a reflectance of 3% or less is formed on one facet and a reflection film having a reflectance of 90% or more is formed on the other facet.

* * * * *